United States Patent
Wu et al.

(10) Patent No.: US 10,746,830 B2
(45) Date of Patent: Aug. 18, 2020

(54) SYSTEMS AND METHODS FOR HYBRID SLICE ENCODING IN THREE-DIMENSIONAL MAGNETIC RESONANCE IMAGING

(71) Applicant: General Electric Company, Schenectady, NY (US)

(72) Inventors: Gaohong Wu, New Berlin, WI (US); Richard Scott Hinks, Waukesha, WI (US); Robert Marc Lebel, Calgary (CA); Moran Wei, Pewaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 98 days.

(21) Appl. No.: 16/115,466

(22) Filed: Aug. 28, 2018

(65) Prior Publication Data

US 2020/0072929 A1 Mar. 5, 2020

(51) Int. Cl.
*G01R 33/483* (2006.01)
*G01R 33/563* (2006.01)
*G01R 33/48* (2006.01)

(52) U.S. Cl.
CPC ....... *G01R 33/4835* (2013.01); *G01R 33/482* (2013.01); *G01R 33/4824* (2013.01); *G01R 33/56366* (2013.01)

(58) Field of Classification Search
CPC combination set(s) only.
See application file for complete search history.

(56) References Cited

U.S. PATENT DOCUMENTS

| | | | |
|---|---|---|---|
| 7,545,141 B2 | 6/2009 | Kimura | |
| 7,750,632 B2 | 7/2010 | Qian et al. | |
| 7,898,254 B2 | 3/2011 | Feinberg et al. | |
| 8,195,274 B2 | 6/2012 | Wong | |
| 2005/0258829 A1* | 11/2005 | Bieri | G01R 33/5613 324/307 |
| 2012/0281901 A1 | 11/2012 | Yoshizawa et al. | |
| 2014/0062474 A1* | 3/2014 | Zhou | A61B 5/055 324/309 |
| 2014/0132264 A1 | 5/2014 | Kim et al. | |
| 2015/0038829 A1* | 2/2015 | Natsuaki | A61B 5/7292 600/413 |
| 2015/0369891 A1 | 12/2015 | Miyazaki et al. | |
| 2016/0033610 A1* | 2/2016 | Srinivasan | G01R 33/482 324/309 |
| 2017/0038447 A1 | 2/2017 | Pipe | |
| 2017/0315202 A1* | 11/2017 | Bhat | G01R 33/5617 |
| 2018/0149721 A1* | 5/2018 | Beck | G01R 33/4826 |

* cited by examiner

*Primary Examiner* — Jay Patidar
(74) *Attorney, Agent, or Firm* — McCoy Russell LLP (57) ABSTRACT

Methods and systems are provided for hybrid slice encoding. In one embodiment, a method for magnetic resonance imaging comprises, during a scan with a pulse sequence, sampling k-space linearly for a predetermined number of echoes, and sampling k-space centrically for remaining echoes of the pulse sequence. In this way, blurriness along the slice direction may be reduced for 3D fast spin echo imaging.

18 Claims, 9 Drawing Sheets

SYSTEMS AND METHODS FOR HYBRID SLICE ENCODING IN THREE-DIMENSIONAL MAGNETIC RESONANCE IMAGING

FIELD

Embodiments of the subject matter disclosed herein relate to medical imaging, such as magnetic resonance imaging (MRI), and more particularly, to slice encoding for MRI.

BACKGROUND

Magnetic resonance imaging (MRI) is a medical imaging modality that can create pictures of the inside of a human body without using x-rays or other ionizing radiation. MRI uses a superconducting magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MRI systems also include gradient coils that produce smaller-amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using reconstruction algorithms.

BRIEF DESCRIPTION

In one embodiment, a method for magnetic resonance imaging comprises, during a scan with a pulse sequence, sampling k-space linearly for a predetermined number of echoes, and sampling k-space centrically for remaining echoes of the pulse sequence. In this way, blurring along the slice direction may be reduced for three-dimensional fast spin echo imaging.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 2:
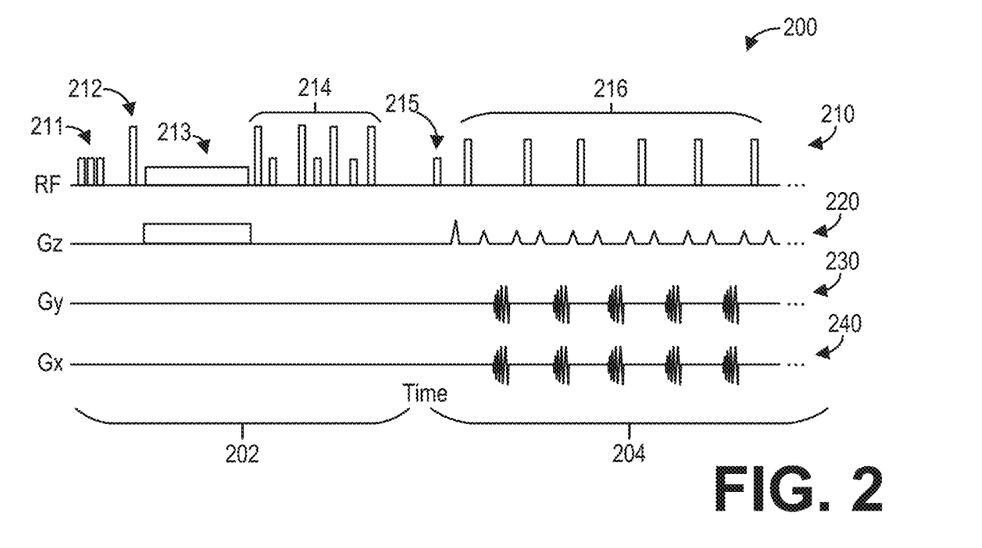
FIGS. 2 and 3 show diagrams illustrating an example pulse sequence for three-dimensional arterial spin labeling (3D ASL) according to an embodiment.
Figure 3:
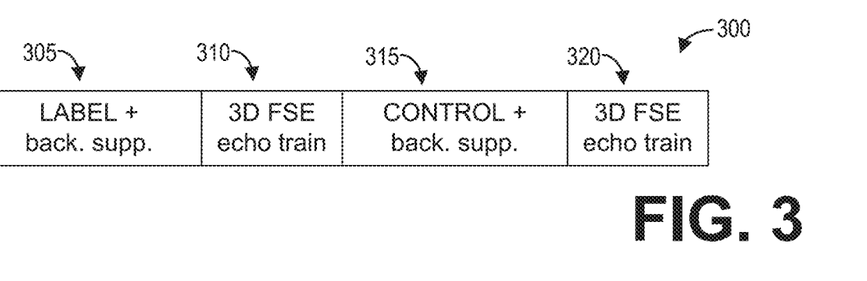
Figure 4:
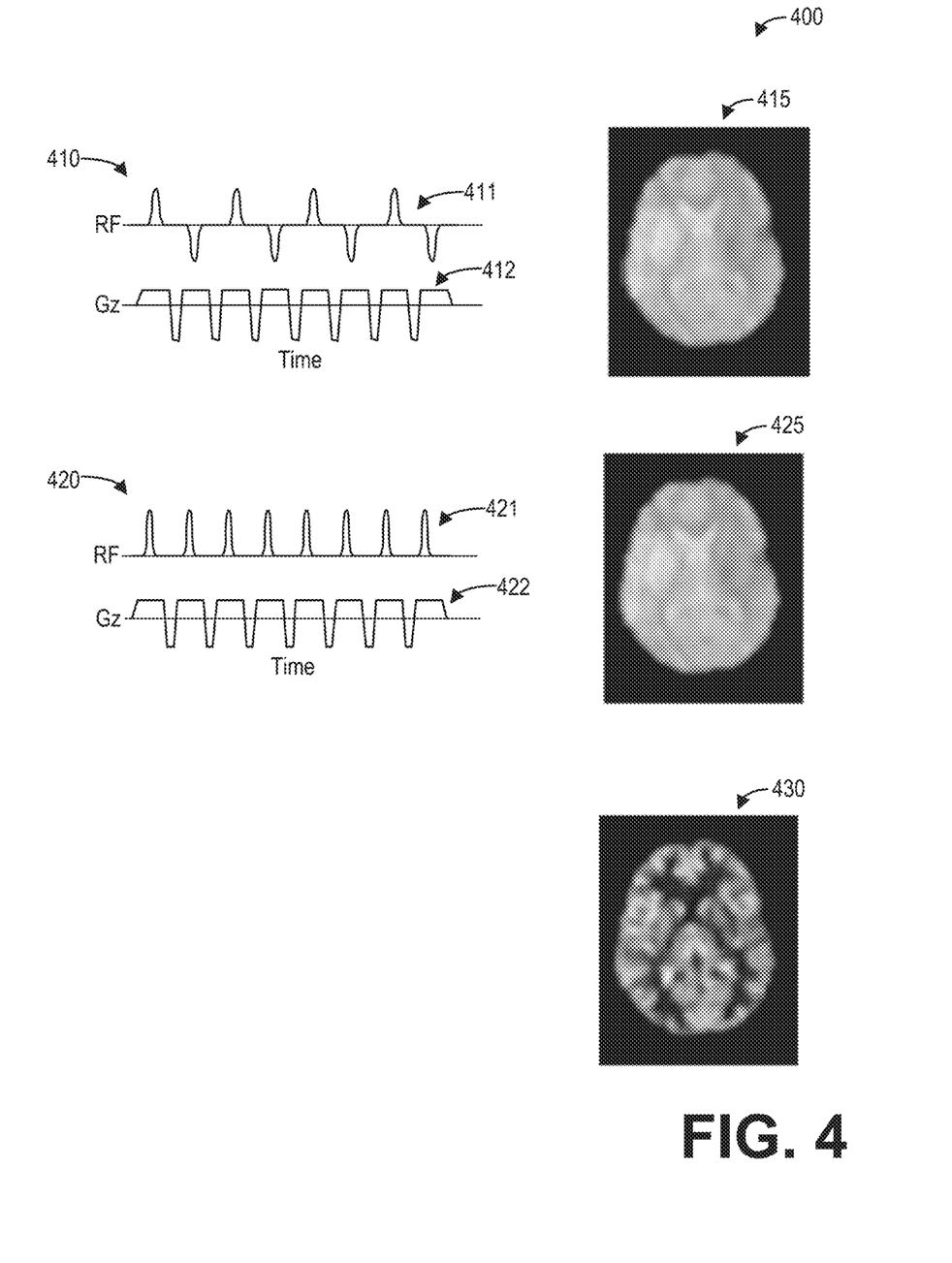
FIG. 4 shows a set of graphs and images illustrating control and labeling pulse sequences for generating a perfusion weighted image according to an exemplary embodiment.
Figure 5:
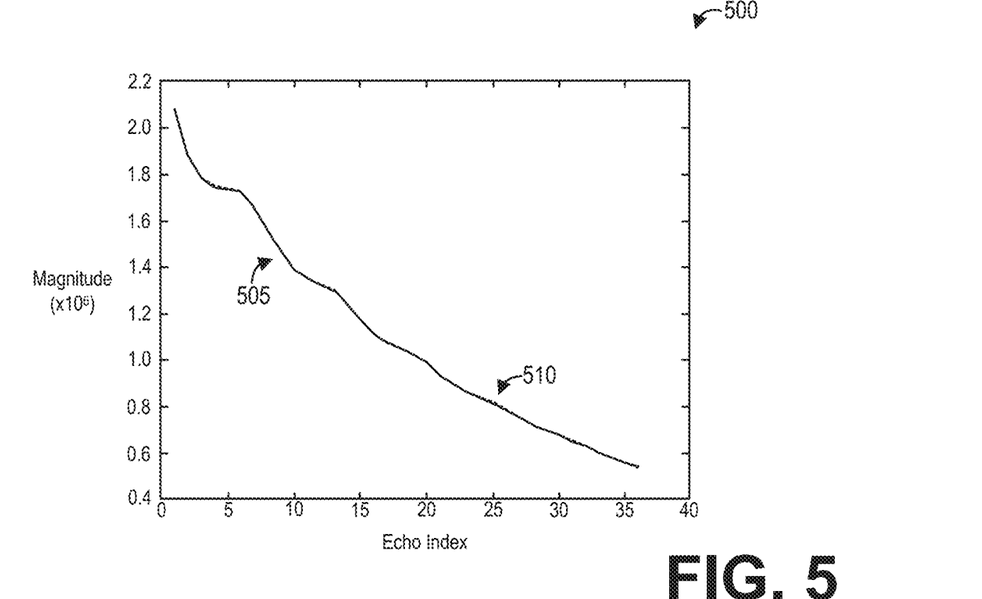
FIG. 5 shows a graph illustrating phantom magnitude data acquired without slice encoding.
Figure 6:
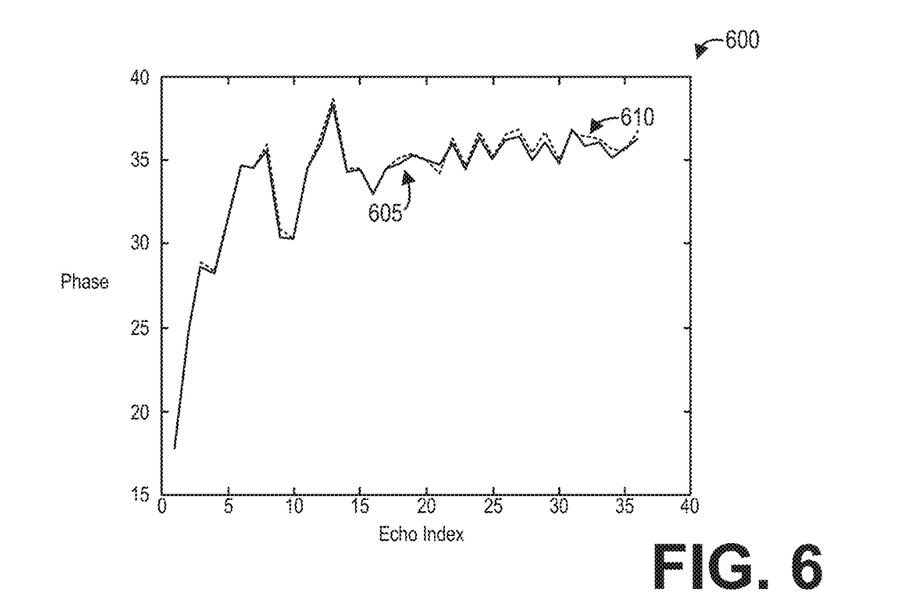
FIG. 6 shows a graph illustrating phantom phase data (in degrees) acquired without slice encoding.
Figure 10:
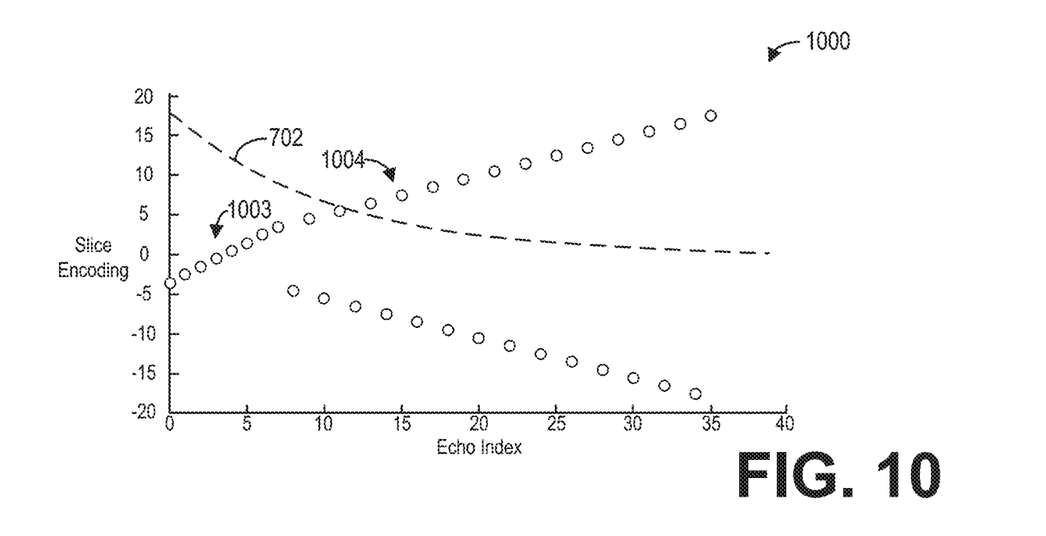
FIG. 10 shows a graph illustrating hybrid slice encoding according to an exemplary embodiment.
Figure 11:
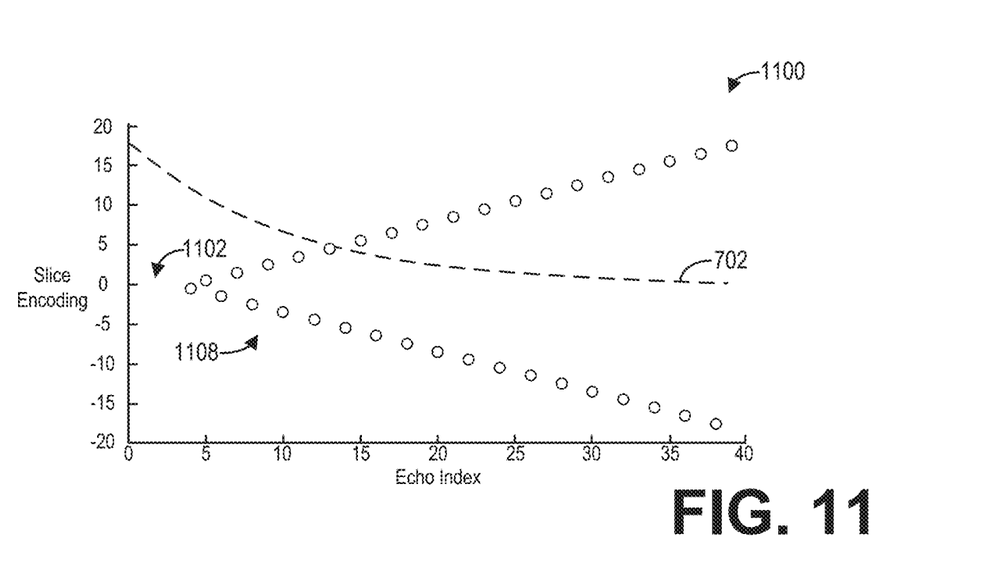
FIG. 11 shows a graph illustrating an example centric slice encoding with echo skipping.
Figure 12:
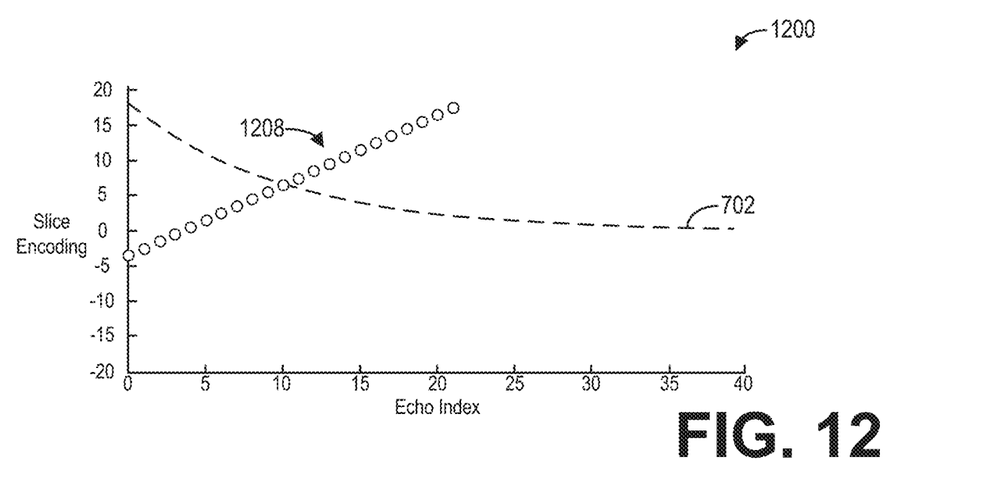
FIG. 12 shows a graph illustrating an example linear partial slice encoding.

The following description relates to various embodiments of reducing image blurring for medical imaging systems. In particular, systems and methods are provided for reducing blurring along a slice direction for images acquired with a medical imaging system, such as the MRI system depicted in FIG. 1. In particular, blurring along the slice direction occurs for images acquired using three-dimensional arterial spin labeling (3D ASL) or other fast spin echo (FSE) techniques, as depicted in FIGS. 2-4. The blurring occurs due to sampling the center of k-space, when the signal magnitude is strongest as depicted in FIG. 5, while the signal phase varies substantially, as depicted in FIG. 6. In particular, FSE imaging techniques such as 3D ASL use centric slice encoding, illustrated in FIG. 7, which exacerbates the blurring along the slice direction. A method for 3D MRI, such as the method depicted in FIG. 8, includes using a hybrid slice encoding technique. A method for a hybrid slice encoding technique, such as the method depicted in FIG. 9, includes using a linear slice encoding during the initial phase variation before switching to a centric slice encoding, as depicted in FIG. 10. In this way, the large phase variation at the k-space center is avoided, thus reducing slice-direction blurring, while the signal from the beginning echoes is kept, thus preserving the signal-to-noise ratio (SNR). Other slice encoding techniques for avoiding the phase variation at the k-space center include centric slice encoding with echo skipping, as depicted in FIG. 11, and linear partial slice encoding, as depicted in FIG. 12. Example images acquired with the slice encoding techniques described herein, such as the images depicted in FIGS. 13-15, demonstrate the efficacy of the hybrid slice encoding in comparison with conventional centric slice encoding, centric slice encoding with echo skipping, and linear partial slice encoding.

Figure 1:
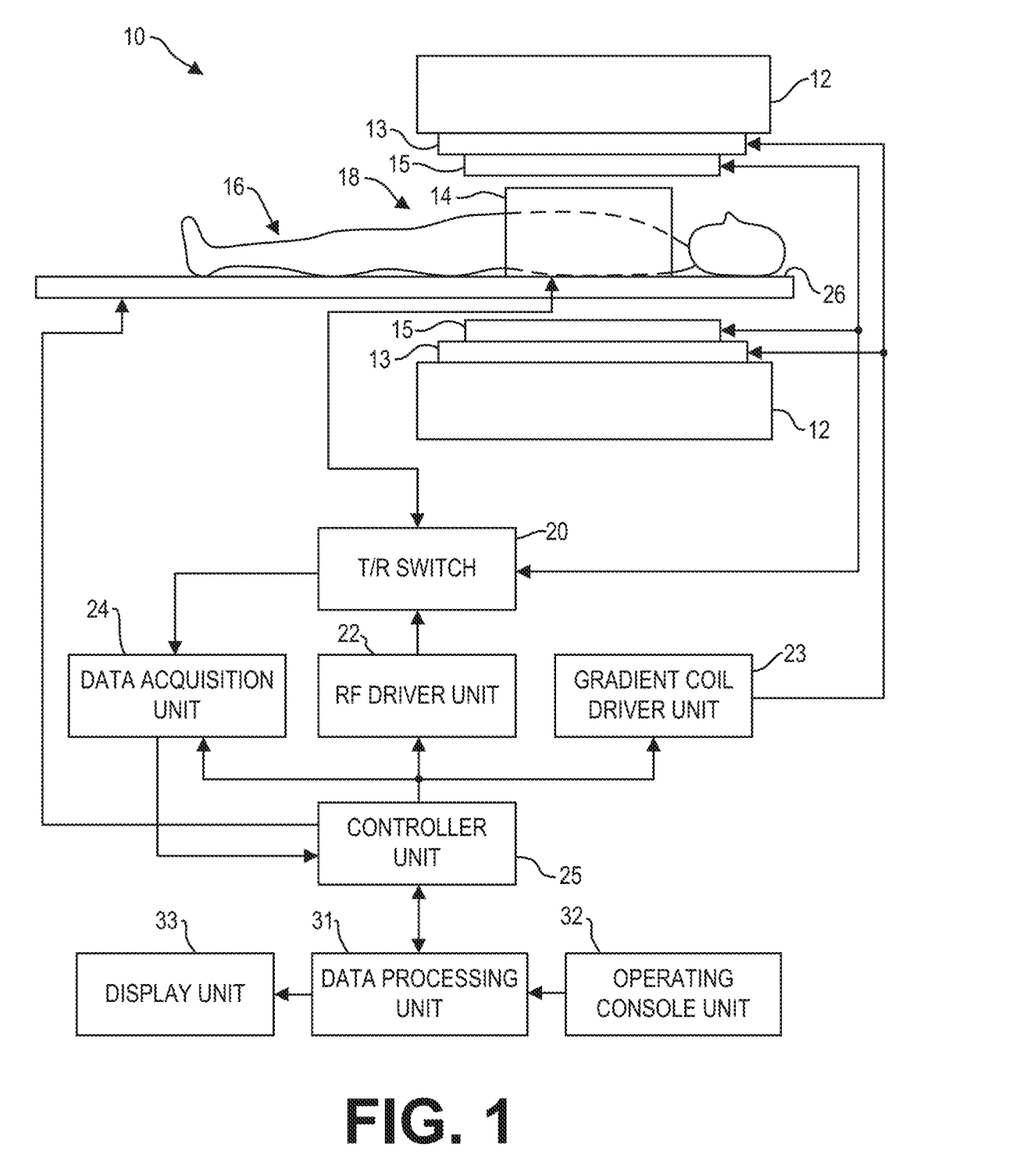
FIG. 1 is a block diagram of an MRI system according to an exemplary embodiment.

FIG. 1 illustrates a magnetic resonance imaging (MRI) apparatus 10 that includes a magnetostatic field magnet unit 12, a gradient coil unit 13, an RF coil unit 14, an RF body coil unit 15, a transmit/receive (T/R) switch 20, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of a slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes the gradient coil unit 13 that generates a gradient magnetic field in the imaging space 18 so as to provide the MR signals received by the RF coil unit 14 with three-dimensional positional information. The gradient coil unit 13 includes three gradient coil systems, each of which generates a gradient magnetic field which includes into one of three spatial axes perpendicular to each other, and generates a gradient field in each frequency-encoding direction, phase-encoding direction, and slice-selection direction in accordance with the imaging condition. More specifically, the gradient coil unit 13 applies a gradient field in the slice-selection direction (or scan direction) of the subject 16, to select the slice; and the RF coil unit 14 transmits an RF pulse to a selected slice of the subject 16 and excites it. The gradient coil unit 13 also applies a gradient field in the phase-encoding direction of the subject 16 to phase encode the MR signals from the slice excited by the RF pulse. The gradient coil unit 13 then applies a gradient field in the frequency-encoding direction of the subject 16 to frequency encode the MR signals from the slice excited by the RF pulse.

The RF coil unit 14 is disposed, for example, to enclose the region to be imaged of the subject 16. In the static magnetic field space or imaging space 18 where a static magnetic field $B_0$ is formed by the magnetostatic field magnet unit 12, the RF coil unit 14 transmits, based on a control signal from the controller unit 25, an RF pulse that is an electromagnetic wave to the subject 16 and thereby generates a high-frequency magnetic field $B_1$. This excites a spin of protons in the slice to be imaged of the subject 16. The RF coil unit 14 receives, as an MR signal, the electromagnetic wave generated when the proton spin thus excited in the slice to be imaged of the subject 16 returns into alignment with the initial magnetization vector. In one embodiment, the RF coil unit 14 may transmit and receive an RF pulse using the same RF coil. In another embodiment, the RF coil unit 14 may be used for only receiving the MR signals, but not transmitting the RF pulse.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MRI apparatus 10. Furthermore, whereas local coils such as those comprising the RF coil unit 14 can transmit to or receive signals from only a localized region of the subject 16, the RF body coil unit 15 generally has a larger coverage area and can be used to transmit or receive signals to the whole body of the subject 16. Using receive-only local coils and transmit body coils provides a uniform RF excitation and good image uniformity at the expense of high RF power deposited in the subject 16. For a transmit-receive local coil, the local coil provides the RF excitation to the region of interest and receives the MR signal, thereby decreasing the RF power deposited in the subject 16. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in a receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 or the RF body coil unit 15 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14 or the RF body coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the RF coil unit 14. In the data acquisition unit 24, the phase detector phase detects, using the output from the RF oscillator of the RF driver unit 22 as a reference signal, the MR signals received from the RF coil unit 14 and amplified by the preamplifier, and outputs the phase-detected analog MR signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as, as non-limiting examples, a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform pre-determined data processing is recorded. The data processing unit 31 is connected to the controller unit 25 and performs data processing based on control signals received from the controller unit 25. The data processing unit 31 is also connected to the data acquisition unit 24 and generates spectrum data by applying various imaging processing operations to the MR signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

FIG. 2 shows a diagram illustrating an example pulse sequence 200 for three-dimensional arterial spin labeling according to an embodiment. The pulse sequence 200 includes a spin preparation sequence or more simply a preparation sequence 202, followed by a three-dimensional spiral fast spin echo (FSE) sequence 204, also referred to as a readout sequence. During the preparation sequence 202, the RF pulse sequence 210 includes pre-saturation pulses 211, a selective inversion pulse 212, a labeling pulse 213, as well as saturation and background suppression pulses 214, while the Gz pulse sequence 220 includes a pulse corresponding to the labeling pulse 213.

During the 3D spiral FSE sequence 204 or the readout sequence 204, the RF pulse sequence 210 includes a first 90° RF pulse 215 followed by a series of refocusing RF pulses 216, while the Gz pulse sequence 220 includes a plurality of slice encoding pulses. The Gy pulse sequence 230 and the Gz pulse sequence 240 both include a plurality of echoes, wherein each echo follows a corresponding refocusing RF pulse of the RF pulse sequence 210, as depicted.

FIG. 3 shows a higher-level diagram illustrating an example pulse sequence 300 for three-dimensional arterial spin labeling. In particular, the pulse sequence 300 includes a labeling and background suppression sequence 305, corresponding to the preparation sequence 202 described hereinabove, followed by a 3D FSE echo train 310, corresponding to the 3D spiral FSE sequence 204 described hereinabove. The 3D FSE echo train 310 is followed by a second preparation sequence comprising a control and background suppression sequence 315, which in turn is followed by another 3D FSE echo train 320. The entire pulse sequence 300 may be repeated for a number of excitations and interleaves. As known in the art of ASL, the image from dataset acquired during the 3D FSE echo train sequence 310 comprises a labeling image while the image from dataset acquired during the 3D FSE echo train sequence 320 comprises a control image, and a perfusion weighted image is obtained by subtracting the control image and the labeling image.

For example, FIG. 4 shows a set of graphs and images 400 illustrating a control pulse sequence 410 and a labeling pulse sequence 420 for generating a perfusion weighted image 430. The average amplitude of the RF pulse sequence 411 of the control pulse sequence 410 is zero, while the average gradient of the Gz pulse sequence 412 of the control pulse sequence 410 is also zero over time. An example control image 415 is reconstructed from k-space data acquired during the control sequence 410. In contrast, the average amplitude of the RF pulse sequence 421 of the labeling pulse sequence 420 is non-zero, while the average gradient of the Gz pulse sequence 422 of the labeling pulse sequence is also non-zero over time. An example labeling image 425 is reconstructed from k-space data acquired during the labeling sequence 420. The perfusion weighted (PW) image 430 is generated by subtracting the labeling image 425 from the control image 415.

Blurring along the slice direction is observable in images acquired via 3D ASL imaging as described hereinabove, and in 3D FSE imaging in general.

FIG. 5 shows a graph 500 illustrating the magnitude data of MR signal acquired from a phantom without slice encoding. The graph 500 includes a plot 505 of magnitude data corresponding to control sequences (in solid line) and a plot 510 of magnitude data corresponding to labeling sequences (in dashed line) over a plurality of echoes. For both the control and the labeling sequences, the signal decays substantially over the readout echo train. Meanwhile, FIG. 6 shows a corresponding graph 600 illustrating the phase data of the MR signal acquired from the phantom without slice encoding, including a plot 605 of the phase data corresponding to control sequences (in solid line) and a plot 610 of phase data corresponding to labeling sequences (in dashed line) over the plurality of echoes. As observed in graph 600, the phase illustrated by both plots 605 and 610 jumps substantially within the first few echoes.

This clearly observable phase jump, which occurs because the echo train has not reached a steady state yet, is responsible for the blurring along the slice direction. More specifically, the phase jump in conjunction with a centric slice encoding is responsible for the blurring along the slice direction.

Figure 7:
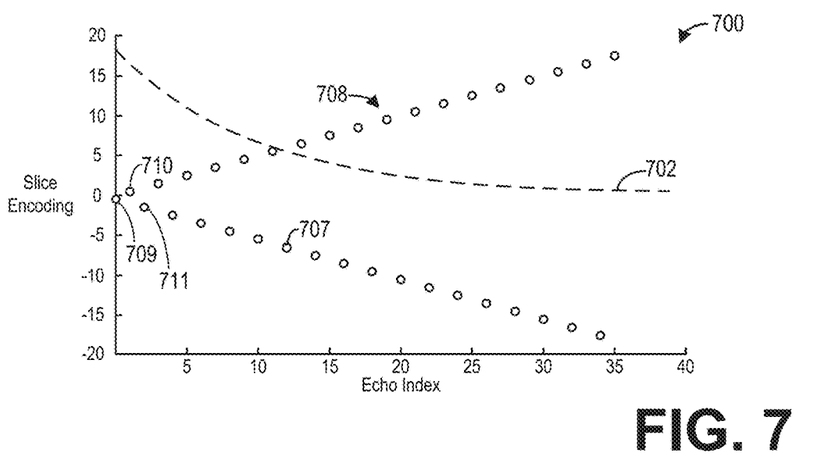
FIG. 7 shows a graph illustrating an example centric slice encoding.

As an example, FIG. 7 shows a graph 700 illustrating centric slice encoding. The graph 700 includes an illustration of the signal decay 702 during the readout sequence. The graph 700 further depicts a plurality of points 708 wherein each point 707 indicates the slice encoding for a given echo. The slice encoding number corresponds to the locations of the k-space sampled with the given echo. If the k-space center is represented by slice encoding number "0" as shown, then the lower the absolute value of the slice encoding number, the region closer to the center of k-space center is sampled. For the centric slice encoding scheme, k-space is sampled beginning at the center of k-space (i.e., at 0 slice encoding) at the $0^{th}$ echo 709, then moves to positive k-space for the 1st echo 710, negative k-space for the 2nd echo 711, and so on in an interleaved fashion until the k-space is filled.

As mentioned above, sampling the center of k-space as illustrated by FIG. 7 during the phase jump depicted in FIG. 6 causes blurring along the slice direction. As described further herein, the blurring along the slice direction may be reduced or eliminated by utilizing a hybrid slice encoding scheme comprising a combination of linear slice encoding and centric slice encoding.

Figure 8:
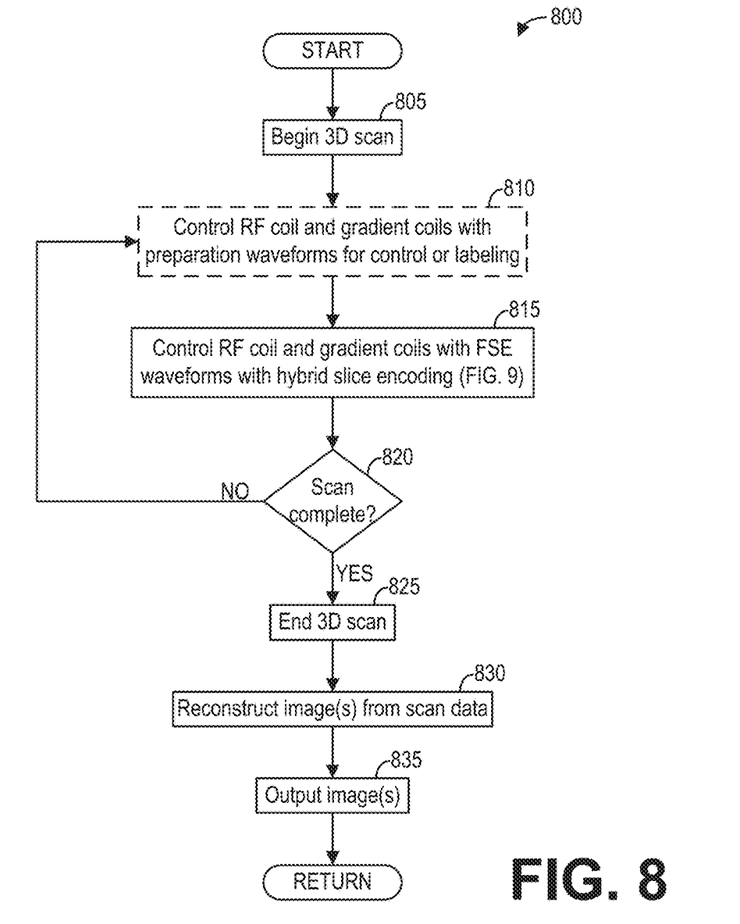
FIG. 8 shows a high-level flow chart illustrating an example method for a three-dimensional scan with hybrid slice encoding according to an embodiment.

FIG. 8 shows a high-level flow chart illustrating an example method 800 for a three-dimensional scan with hybrid slice encoding according to an embodiment. Method 800 is described with regard to the systems and components of FIG. 1, though it should be appreciated that the method 800 may be implemented with other systems and components without departing from the scope of the present disclosure. Method 800 may be stored as executable instructions in non-transitory memory of a computing device of the MRI apparatus 10, for example.

Method 800 begins at 805. At 805, method 800 begins a 3D scan. The 3D scan may comprise a 3D ASL scan, as a non-limiting example, or another type of 3D scan that includes a 3D FSE pulse sequence as described hereinabove with regard to FIG. 2.

In the case that the 3D scan comprises a 3D ASL scan, at 810, method 800 optionally controls the RF coil and the gradient coils with preparation waveforms for a control or a labeling pulse sequence. For example, method 800 may control the RF coil and one or more gradient coils to generate pre-saturation pulses, selective inversion pulses, labeling or control pulses, saturation pulses, and background suppression pulses as described hereinabove with regard to FIGS. 2-4.

After optionally performing the preparation sequence at 810, method 800 continues to 815. At 815, method 800 controls the RF coil and the gradient coils with a FSE pulse sequence, such as the FSE pulse sequence described hereinabove with regard to FIG. 2, with a hybrid slice encoding. The hybrid slice encoding comprises linear slice encoding for a predetermined number of echoes in the FSE pulse sequence, followed by centric slice encoding for the remaining echoes of the FSE pulse sequence. An example method for hybrid slice encoding is described further herein with regard to FIG. 9.

At 820, method 800 determines whether the scan is complete. If the scan is not complete ("NO"), method 800 returns to 810, wherein method 800 controls the coils with preparation waveforms for control or labeling. In particular, method 800 uses control or labeling waveforms according to which pulse sequence was utilized in the previous iteration, such that the scan alternates between control and labeling sequences as described hereinabove with regard to FIGS. 2-4. For example, during a first iteration, method 800 controls the coils with a labeling pulse sequence, and during a second iteration following the first iteration, method 800 controls the coils with a control pulse sequence, and so on until method 800 determines that the scan is complete at 820.

Referring again to 820, once the scan is complete ("YES"), method 800 continues to 825, wherein method 800 ends the 3D scan. Continuing at 830, method 800 reconstructs one or more images from the scan data acquired during the 3D scan. Reconstructing one or more images may comprise reconstructing control and labeling images and generating a PW image from the difference, as described hereinabove, or reconstructing another image from the scan data. At 835, method 800 outputs the one or more images reconstructed at 830, for example for display via a display unit 33 or to a storage device for subsequent retrieval. An image acquired with hybrid slice encoding as described herein exhibits less blurring along the slice direction, especially when compared to an image acquired with centric slice encoding or other slice encoding techniques. Method 800 then returns.

Figure 9:
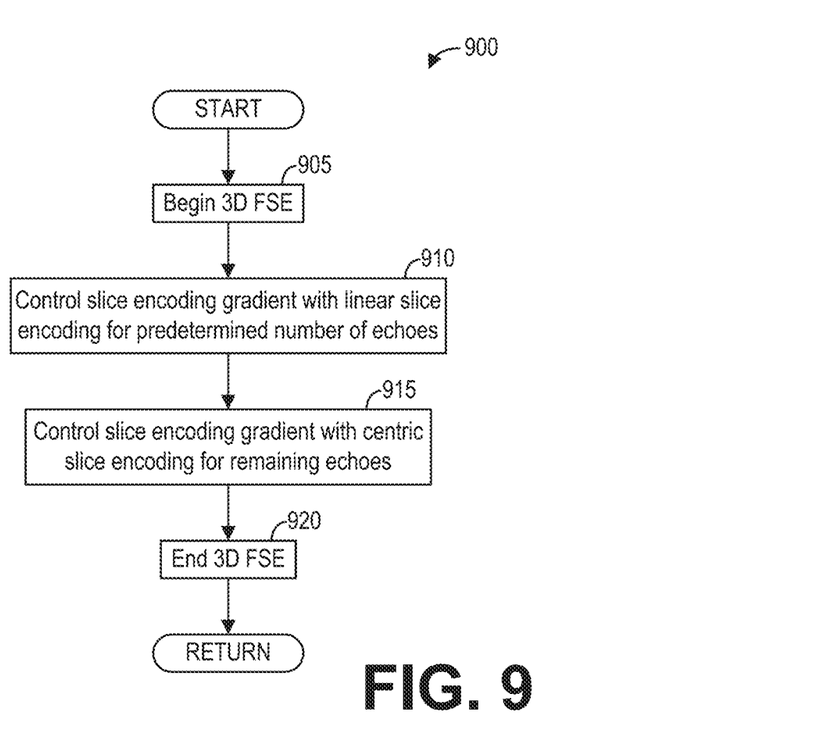
FIG. 9 shows a high-level flow chart illustrating an example method for hybrid slice encoding according to an embodiment.

FIG. 9 shows a high-level flow chart illustrating an example method 900 for hybrid slice encoding according to an embodiment. Method 900 is described with reference to the systems and components of FIG. 1, though it should be appreciated that the method 900 may be implemented with other systems and components without departing from the scope of the present disclosure.

Method 900 begins at 905. At 905, method 900 begins a 3D FSE sequence. That is, method 900 begins controlling one or more RF coils and gradient coils according to a 3D FSE pulse sequence, for example as described hereinabove with regard to FIG. 2.

During the 3D FSE sequence, at 910, method 900 controls the slice encoding gradient with linear slice encoding for a predetermined number of echoes. The number of echoes may be predetermined such that the slice encoding is linear while a large phase variation exists at the beginning of the echo train. As an illustrative example, FIG. 10 shows a graph 1000 illustrating a hybrid slice encoding, including a linear slice encoding 1003 at the beginning of the echo train.

In some examples, the linear slice encoding may range from a negative value to a positive value sequentially in k-space. For example, for k-space ranging from −kmax to +kmax, the slice encoding may begin at a negative value −kb and move sequentially to a positive value +kb (i.e., from −kb, to −kb+1, −kb+2, . . . to +kb−1, +kb), wherein kb<kmax. Furthermore, the range [−kb, +kb] of the linear slice encoding may be selected or predetermined such that the linear slice encoding crosses zero, or the center of k-space, when the large phase variation or phase jump at the beginning of the echo train ends. For example, as depicted in FIG. 6, the large phase variation settles down around the fourth echo (echo index three). As depicted in FIG. 10, the linear slice encoding 1003 ranges from slice encoding number −4 sequentially to 4 (e.g., from −4 to −3, −2, −1, 0, 1, 2, 3, 4), with the linear slice encoding cross the slice encoding number 0 at the fourth echo (echo index three). Thus, in the example depicted in FIG. 10, the range [−kb,+kb] is set to encoding number [−4,+4] such that the linear slice encoding 1003 uses the first eight echoes of the echo train. The number of echoes at which the linear slice encoding ends may be considered a predetermined number of echoes.

Alternatively, in one or more examples, sampling k-space linearly (or sequentially) for the predetermined number of echoes comprises encoding a positive slice encoding number for a first echo of the pulse sequence, and linearly decreasing a slice encoding number for encoding subsequent echoes of the pulse sequence until the predetermined number of echoes is reached.

Continuing at 915, method 900 controls the slice encoding gradient with centric slice encoding for the remaining echoes. That is, for the remaining echoes of the echo train in the 3D FSE sequence, the slice encoding is centric for the slice ranges [−kmax, −kb) and (+kb, +kmax], e.g., from −kb−1, to +kb+1, to −kb−2, to +kb+2, etc. In the example depicted in FIG. 10, the centric slice encoding 1004 begins at slice encoding number −5 after the linear slice encoding 1003 ends, then goes to slice encoding number +5, encoding number −6, encoding number +6, and so on. After covering the remainder of k-space for the remainder of the echo train with centric slice encoding, method 900 continues to 920. At 920, method 900 ends the 3D FSE sequence. Method 900 then returns.

Thus, a method for reducing blurring along the slice direction for 3D MRI includes sampling k-space with a linear (or sequential) slice encoding scheme for a predetermined number of echoes, followed by a centric slice encoding scheme for the remaining echoes of the echo train.

Other slice encoding techniques may be used to address the blurring along the slice direction. For example, FIG. 11 shows a graph 1100 illustrating centric slice encoding 1108 with echo skipping. In particular, the centric slice encoding 1108 begins at k-space center after skipping a predetermined number of echoes, creating a slice encoding gap 1102 in the beginning of the echo train. Skipping the predetermined number of echoes helps reduce the blurring, but may reduce the signal-to-noise ratio (SNR), or more specifically causes signal reduction per the T2 decay.

As another example of a slice encoding technique to reduce blurring along the slice direction, FIG. 12 shows a graph 1200 illustrating linear partial slice encoding 1208. As depicted, the linear slice encoding 1208 begins at −kb, similar to the linear slice encoding 1003 of the hybrid slice encoding technique, but extends linearly (or sequentially) to +kmax. As depicted, no echoes are slice encoded in the range [−kmax, −kb], hence the k-space coverage is asymmetric or partial. The negative portions of k-space that are not filled may be synthesized or interpolated from the acquired data during image reconstruction, for example by using partial Fourier imaging techniques.

Figure 13:
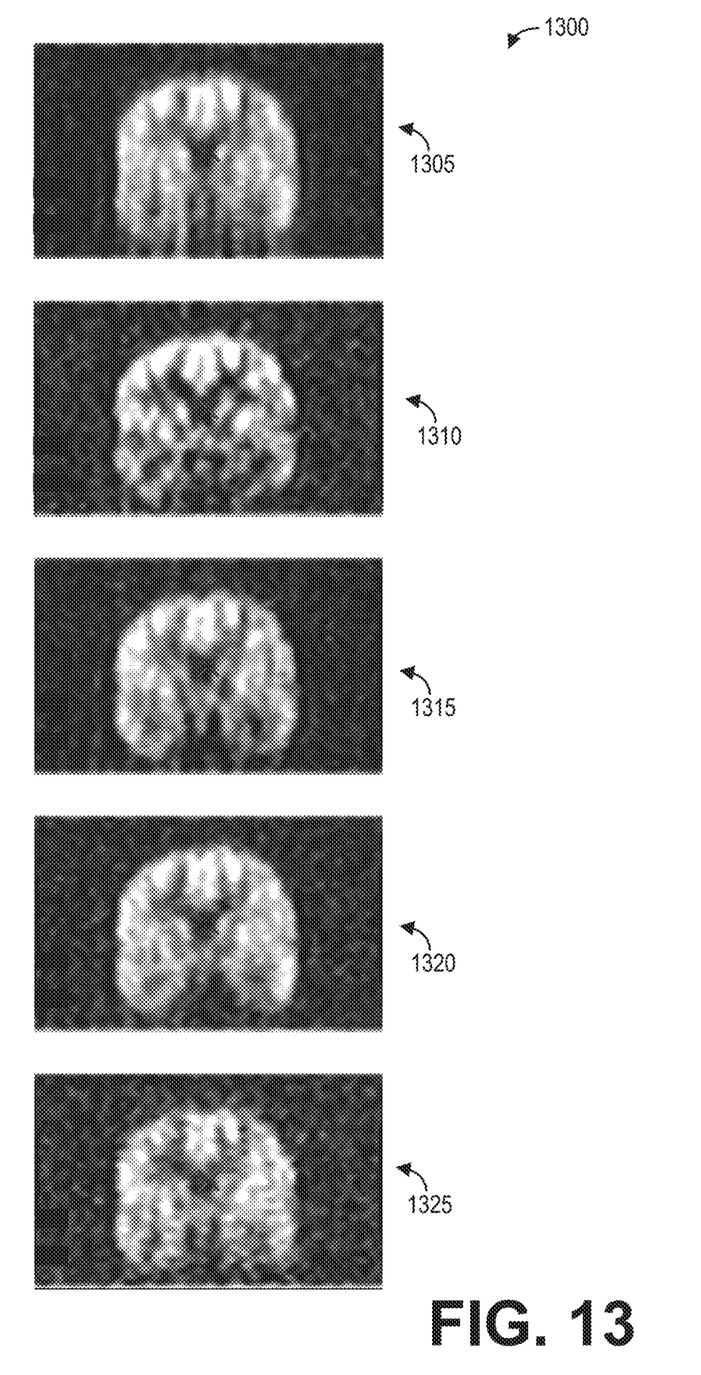
FIG. 13 shows a set of images acquired with different slice encoding techniques.

FIG. 13 shows a set of images 1300 acquired with different slice encoding techniques. Image 1305 is acquired with centric slice encoding, and thus exhibits significant blurring along the slice direction. Image 1310 is acquired with hybrid slice encoding as described herein, wherein the linear segment of the hybrid slice encoding lasts for sixteen echoes. Image 1315 is acquired with hybrid slice encoding, wherein the linear segment of the hybrid slice encoding lasts for eight echoes. The blurriness along the slice direction in images 1310 and 1315 is reduced with respect to image 1305, though the SNR of the image 1310 may be undesirably low in comparison to image 1315. Image 1320 is acquired with centric slice encoding, wherein the first four echoes are skipped. Image 1325 is acquired with centric slice encoding, wherein the first six echoes are skipped. While the echo skipping for both images 1320 and 1325 reduces the blurring along the slice direction by avoiding the large phase variation at the beginning of the FSE pulse sequence, the strong signal from the early echoes is missing from the dataset and thus the SNR is substantially lower with respect to the images 1310 and 1315. Thus, of the images 1300, the image 1315 is the most balanced with regard to blurring and SNR.

Figure 14:
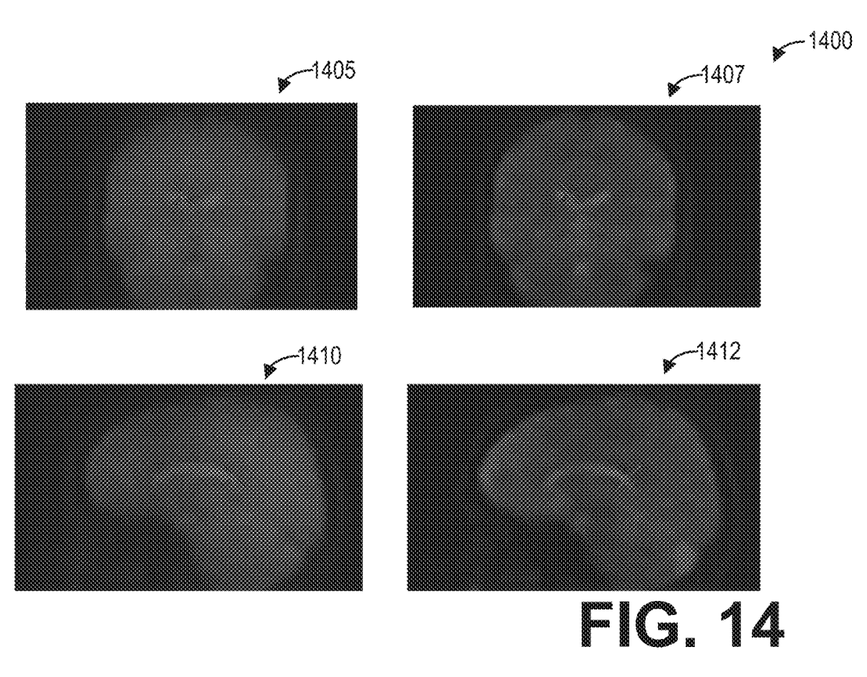
FIG. 14 shows a set of proton density images acquired with centric slice encoding and with hybrid slice encoding.

As another example, FIG. 14 shows a set of proton density images 1400 acquired with centric slice encoding versus with hybrid slice encoding. In particular, image 1405 shows a coronal view acquired with centric slice encoding, while image 1407 shows a coronal view of the same subject acquired with hybrid slice encoding. Image 1410 shows a sagittal view acquired with centric slice encoding, while image 1412 shows a sagittal view acquired with hybrid slice encoding. The images 1407 and 1412 exhibit a substantial reduction in blurring along the slice direction in comparison with the corresponding images 1405 and 1410.

Figure 15:
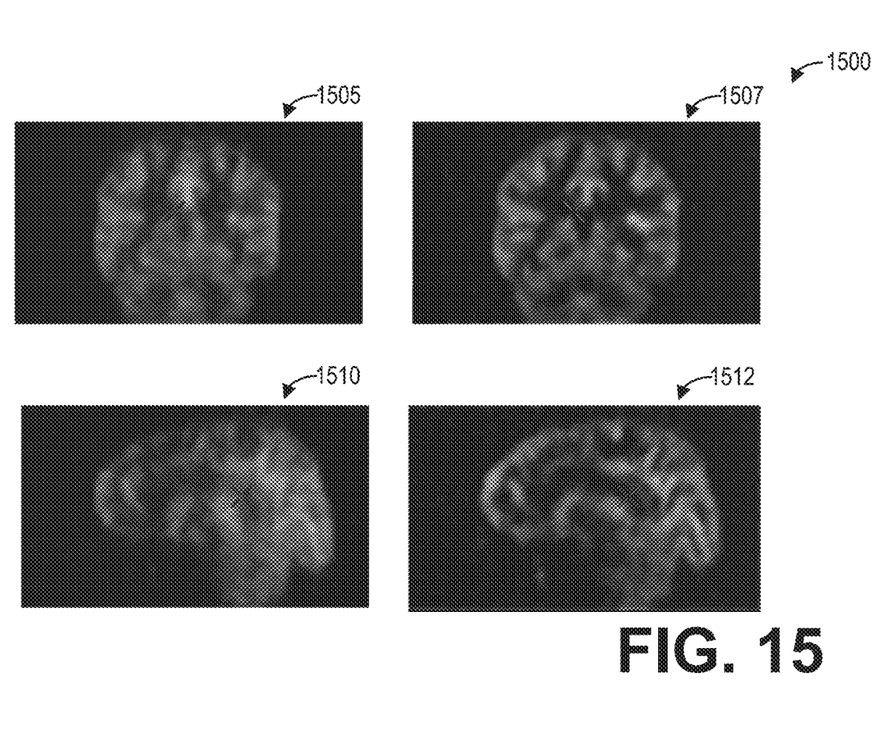
FIG. 15 shows a set of perfusion weighted images acquired with centric slice encoding and with hybrid slice encoding.

As yet another example, FIG. 15 shows a set of perfusion weighted images 1500 acquired with centric slice encoding versus with hybrid slice encoding. In particular, image 1505 shows a coronal view acquired with centric slice encoding, whereas image 1507 shows a coronal view acquired with hybrid slice encoding. Image 1510 shows a sagittal view acquired with centric slice encoding, while image 1512 shows a sagittal view acquired with hybrid slice encoding. The reduction in blurring along the slice direction is even more substantial in the images 1507 and 1512 in comparison to the proton density images 1407 and 1412, indicating that the hybrid slice encoding technique described herein is especially advantageous for perfusion weighted imaging.

A technical effect of the disclosure includes encoding slices linearly and centrically during magnetic resonance imaging. Another technical effect of the disclosure includes the reconstruction and display of images with reduced blurring in the slice direction.

Thus, provided herein are methods and systems for magnetic resonance (MR) imaging. In a first example method, during a scan with a pulse sequence, k-space may be sampled linearly for a predetermined number of echoes, and k-space may be sampled centrically for remaining echoes of the pulse sequence. In a second example method which may optionally include the first example method, sampling the k-space linearly for the predetermined number of echoes may comprise acquiring MR data along a first slice encoding which is offset from a k-space center for a first echo of the pulse sequence, and then acquiring MR data sequentially for slice encodings until the predetermined number of echoes is reached. In one or more example methods, sampling the k-space linearly for the predetermined number of echoes may further comprise acquiring MR data along a slice encoding at the k-space center. In another example method which may include one or more of the features described above, phase variation in the MR data acquired along the slice encoding at the k-space center may be less than phase variation in the MR data acquired along the first slice encoding. Furthermore, in one or more example methods, sampling the k-space centrically for the remaining echoes of the pulse sequence may comprise acquiring MR data alternating between slice encodings at both sides of the slice encoding at the k-space center for each echo of the remaining echoes. Optionally, one or more of the example methods may include a pulse sequence that comprises a three-dimensional fast spin echo pulse sequence, and controlling a radiofrequency coil and a plurality of gradient coils according to the pulse sequence multiple times during the scan, wherein the k-space is sampled linearly and centrically each time.

In a further example method, which may optionally include one or more of the method features described above, a method for magnetic resonance imaging may comprise acquiring k-space data with a linear k-space trajectory and a centric k-space trajectory, and reconstructing an image from the acquired k-space data. In another example method which optionally includes one or more of the method features described above, acquiring the k-space data with the linear k-space trajectory may comprise acquiring the k-space data sequentially starting from a slice encoding which is offset from a k-space center.

Acquiring the k-space data with the centric k-space trajectory may comprise acquiring the k-space data alternating between slice encodings at both sides of a slice encoding at the k-space center, in one or more example methods. Moreover, in at least one example method, the linear k-space trajectory may cross the center of the k-space after a phase jump of a pulse sequence is substantially reduced. Further, in one or more examples, acquiring the k-space data with the linear k-space trajectory may be for a predetermined number of echoes. Additionally, in one or more examples, the centric k-space trajectory may be switched to after the predetermined number of echoes.

In at least one example method, which may optionally include one or more features of the above-described methods, comprises acquiring additional k-space data with the linear k-space trajectory and the centric k-space trajectory, reconstructing a second image from the additional k-space data, and generating a perfusion weighted image from a difference between the image and the second image.

In an example MR imaging system, the MR imaging system may comprise, a radiofrequency (RF) coil, a gradient coil unit including a plurality of gradient coils, and a processor communicatively coupled to the RF coil and the gradient coil unit and configured with instructions that when executed cause the processor to carry out any one of the example methods described above. For example, the instructions may cause the processor to, during a scan with a pulse sequence, control the RF coil and the gradient coils to sample k-space linearly for a predetermined number of echoes of the pulse sequence and sample the k-space centrically for remaining echoes of the pulse sequence. In one or more examples, sampling the k-space linearly for the predetermined number of echoes may comprise, acquiring MR data along a first slice encoding which is offset from a k-space center for a first echo of the pulse sequence, and then acquiring MR data sequentially for slice encodings until the predetermined number of echoes is reached. Further, in at least one example, sampling the k-space linearly for the predetermined number of echoes may further comprise acquiring MR data along a slice encoding at the k-space center. In one or more example systems, phase variation in the MR data acquired along the slice encoding at the k-space center may be less than phase variation in the MR data acquired along the first slice encoding. Further, in one or more examples, the processor may be further configured to reconstruct an image from data acquired during the scan. In at least one example system, sampling the k-space centrically for the remaining echoes of the pulse sequence may comprise acquiring MR data alternating between slice encodings at both sides of the slice encoding at the k-space center for each echo of the remaining echoes. Further, in at least one example, phase variation in MR data acquired along a slice encoding may be substantially reduced after the predetermined number of echoes.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance (MR) imaging, comprising:
   during a scan with a pulse sequence, sampling k-space linearly for a predetermined number of echoes, wherein sampling the k-space linearly for the predetermined number of echoes comprises acquiring MR data along a first slice encoding which is offset from a k-space center for a first echo of the pulse sequence, and then acquiring MR data sequentially for slice encodings until the predetermined number of echoes is reached; and
   sampling k-space centrically for remaining echoes of the pulse sequence.

2. The method of claim 1, wherein sampling the k-space linearly for the predetermined number of echoes further comprises acquiring MR data along a slice encoding at the k-space center.

3. The method of claim 2, wherein phase variation in the MR data acquired along the slice encoding at the k-space center is less than phase variation in the MR data acquired along the first slice encoding.

4. The method of claim 1, wherein sampling the k-space centrically for the remaining echoes of the pulse sequence comprises acquiring MR data alternating between slice encodings at both sides of a slice encoding at the k-space center for each echo of the remaining echoes.

5. The method of claim 1, wherein the pulse sequence comprises a three-dimensional fast spin echo pulse sequence, and further comprising controlling a radiofrequency coil and a plurality of gradient coils according to the pulse sequence multiple times during the scan, wherein the k-space is sampled linearly and centrically each time.

6. A method for magnetic resonance imaging, comprising:
   acquiring k-space data with a linear k-space trajectory for a predetermined number of echoes in a pulse sequence, the predetermined number of echoes selected such that the linear k-space trajectory crosses a k-space center when a phase jump of the pulse sequence settles, and a centric k-space trajectory for remaining echoes of the pulse sequence; and
   reconstructing an image from the acquired k-space data.

7. The method of claim 6, wherein acquiring the k-space data with the linear k-space trajectory comprises acquiring the k-space data sequentially starting from a slice encoding which is offset from the k-space center.

8. The method of claim 7, wherein acquiring the k-space data with the centric k-space trajectory comprises acquiring the k-space data alternating between slice encodings at both sides of a slice encoding at the k-space center.

9. The method of claim 7, wherein the linear k-space trajectory crosses the k-space center when the phase jump of the pulse sequence is settled.

10. The method of claim 7, wherein the linear k-space trajectory ranges from a negative k-space value to a positive k-space value.

11. The method of claim 10, wherein an absolute value of the negative k-space value is equal to the positive k-space value, and wherein the linear k-space trajectory begins at the negative k-space value or the positive k-space value.

12. The method of claim 6, further comprising acquiring additional k-space data with the linear k-space trajectory and the centric k-space trajectory, reconstructing a second image from the additional k-space data, and generating a perfusion weighted image from a difference between the image and the second image.

13. An MR imaging system, comprising:
a radiofrequency (RF) coil;
a gradient coil unit including a plurality of gradient coils;
a processor communicatively coupled to the RF coil and the gradient coil unit and configured with instructions stored in non-transitory memory that when executed cause the processor to:
during a scan with a pulse sequence, control the RF coil and the plurality of gradient coils to sample k-space linearly for a predetermined number of echoes of the pulse sequence and sample the k-space centrically for remaining echoes of the pulse sequence, wherein sampling the k-space linearly for the predetermined number of echoes comprises acquiring MR data along a first slice encoding which is offset from a k-space center for a first echo of the pulse sequence, and then acquiring MR data sequentially for slice encodings until the predetermined number of echoes is reached.

14. The MR imaging system of claim 13, wherein sampling the k-space linearly for the predetermined number of echoes further comprises acquiring MR data along a slice encoding at the k-space center.

15. The MR imaging system of claim 14, wherein phase variation in the MR data acquired along the slice encoding at the k-space center is less than phase variation in the MR data acquired along the first slice encoding.

16. The MR imaging system of claim 13, wherein the processor is further configured to reconstruct an image from data acquired during the scan.

17. The MR imaging system of claim 13, wherein sampling the k-space centrically for the remaining echoes of the pulse sequence comprises acquiring MR data alternating between slice encodings at both sides of a slice encoding at the k-space center for each echo of the remaining echoes.

18. The MR imaging system of claim 13, wherein phase variation in MR data acquired along a slice encoding is substantially reduced after the predetermined number of echoes.

* * * * *